(12) United States Patent
Yang et al.

(10) Patent No.: US 12,426,386 B2
(45) Date of Patent: *Sep. 23, 2025

(54) PROCESS AND STRUCTURE OF OVERLAY OFFSET MEASUREMENT

(71) Applicant: Himax Technologies Limited, Tainan (TW)

(72) Inventors: Ya-Jing Yang, Tainan (TW); Po Nan Chen, Tainan (TW); Yu-Jui Hsieh, Tainan (TW)

(73) Assignee: Himax Technologies Limited, Tainan (TW)

( * ) Notice: Subject to any disclaimer, the term of this patent is extended or adjusted under 35 U.S.C. 154(b) by 242 days.

This patent is subject to a terminal disclaimer.

(21) Appl. No.: 18/078,831

(22) Filed: Dec. 9, 2022

(65) Prior Publication Data

US 2023/0106533 A1 Apr. 6, 2023

Related U.S. Application Data

(62) Division of application No. 16/874,045, filed on May 14, 2020, now Pat. No. 11,581,353.

(51) Int. Cl.
| | |
|---|---|
| *H10F 39/00* | (2025.01) |
| *G03F 1/70* | (2012.01) |
| *H01L 23/544* | (2006.01) |

(52) U.S. Cl.
CPC ............ *H10F 39/026* (2025.01); *G03F 1/70* (2013.01); *H01L 23/544* (2013.01); *H10F 39/024* (2025.01); *H10F 39/8063* (2025.01); *H01L 2223/54426* (2013.01)

(58) Field of Classification Search
CPC .. H10F 39/026; H10F 39/8063; H10F 39/024; H01L 23/544
See application file for complete search history.

(56) References Cited

U.S. PATENT DOCUMENTS 11,581,353 B2 * 2/2023 Yang ................. H01L 27/14627
2014/0363969 A1 12/2014 Chen et al.

\* cited by examiner

*Primary Examiner* — Nathan W Ha
(74) *Attorney, Agent, or Firm* — Stout, Uxa & Buyan, LLP; Donald E. Stout

(57) ABSTRACT

A process of overlay offset measurement includes providing a substrate; forming a first pattern layer with a predetermined first pattern on the substrate; forming a first photoresist layer on the substrate and the first pattern layer; forming a second photoresist layer on the first photoresist layer; forming a second pattern layer with a predetermined second pattern on the second photoresist layer; patterning the second photoresist layer to form a trench having a predetermined third pattern being substantially aligned with the predetermined first pattern of the first pattern layer; and performing overlay offset measurement according to the second pattern layer and the trench.

8 Claims, 2 Drawing Sheets

PROCESS AND STRUCTURE OF OVERLAY OFFSET MEASUREMENT

CROSS-REFERENCE TO RELATED APPLICATIONS

This application is a divisional application of U.S. application Ser. No. 16/874,045, filed on May 14, 2020, the entire contents of which are herein expressly incorporated by reference.

BACKGROUND OF THE INVENTION

1. Field of the Invention

The present invention generally relates to overlay offset measurement, and more particularly to a semiconductor structure and process that facilitate overlay offset measurement.

2. Description of Related Art

As the critical dimension of a semiconductor device progressively decreases due to advancing technology, the tolerance to offset between layers becomes lower. The alignment or overlay measurement between layers may be measured by overlay measure tools.

However, as a layer of an electronic device, such as optoelectronic device, may have a thickness so large (e.g., greater than 14 μm) that overlay offset (or shift) measurement cannot be properly performed while manufacturing the electronic device.

A need has thus arisen to propose a novel scheme to overcome the drawbacks of overlay offset measurement while manufacturing the electronic device.

SUMMARY OF THE INVENTION

In view of the foregoing, it is an object of the embodiment of the present invention to provide a semiconductor structure and process that facilitate overlay offset (or shift) measurement.

According to one embodiment, a process and structure of overlay offset measurement include a substrate, a first pattern layer, a first photoresist layer, a second photoresist layer and a second pattern layer. The first pattern layer with a predetermined first pattern is formed on the substrate. The first photoresist layer is formed on the substrate and the first pattern layer. The second photoresist layer is formed on the first photoresist layer, the second photoresist layer being patterned to form a trench having a predetermined third pattern being substantially aligned with the predetermined first pattern of the first pattern layer. The second pattern layer with a predetermined second pattern is formed on the second photoresist layer, overlay offset measurement being performed according to the second pattern layer and the trench.

DETAILED DESCRIPTION OF THE INVENTION

Figure 1A:
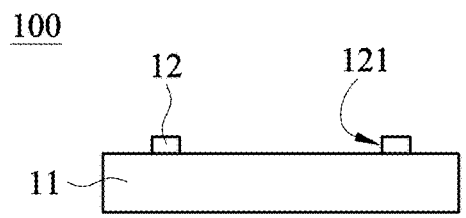
FIG. 1A to FIG. 1D show cross-sectional views illustrating a semiconductor process that facilitates overlay offset measurement while manufacturing an electronic device according to one embodiment of the present invention.
Figure 2A:
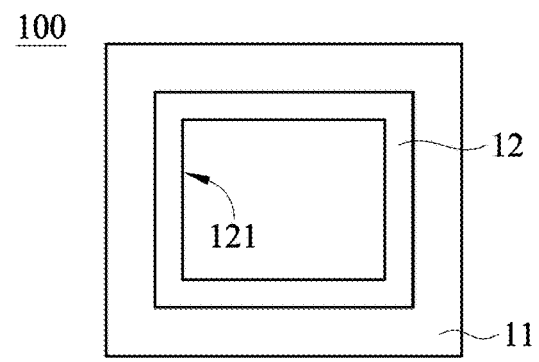
FIG. 2A to FIG. 2C show corresponding top views of FIG. 1A to FIG. 1C.
Figure 1B:
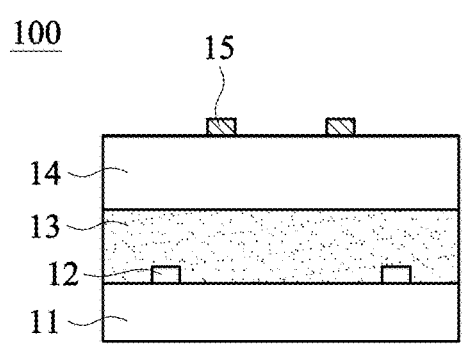
Figure 2B:
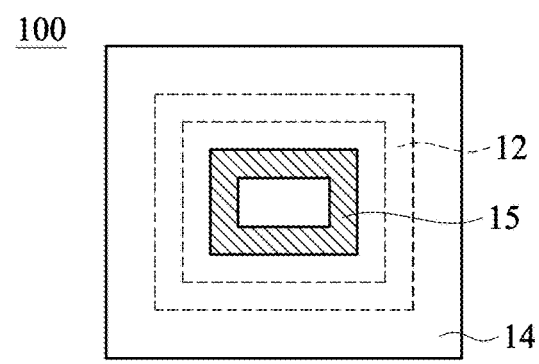
Figure 1C:
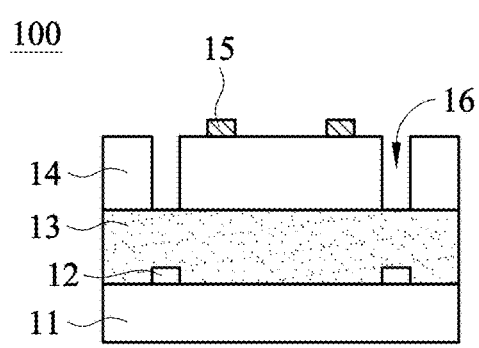
Figure 2C:
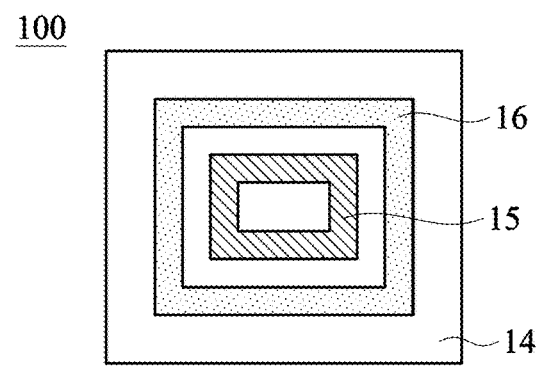

FIG. 1A to FIG. 1D show cross-sectional views (e.g., on a cutting line or path) illustrating a semiconductor process that facilitates overlay offset (or shift or error) measurement while manufacturing an electronic device 100 according to one embodiment of the present invention, and FIG. 2A to FIG. 2C show corresponding top views of FIG. 1A to FIG. 1C. Although an optoelectronic device, such as fingerprint sensor, is exemplified in the embodiment, it is appreciated that the embodiment may be generally adaptable to an electronic device that requires overlay offset measurement to be performed while manufacturing the electronic device.

Referring to FIG. 1A (cross-sectional view) and FIG. 2A (top view), a substrate (e.g., semiconductor wafer or glass) 11 is provided. Next, a first pattern layer 12 with a predetermined first pattern acting as a mark is formed on the substrate 11. In the embodiment, the first pattern layer 12 includes a first frame (i.e., the first pattern) having an opening (or hole) 121 therein.

Referring to FIG. 1B (cross-sectional view) and FIG. 2B (top view), a first photoresist layer 13 is formed on the substrate 11 and the first pattern layer 12, followed by forming a second photoresist layer 14 on the first photoresist layer 13. The first photoresist layer 13 and the second photoresist layer 14 may have the same composition. In the specification, a photoresist layer is a layer composed of light-sensitive material used in processes, such as photolithography and photoengraving, to form a patterned coating on a surface.

According to one aspect of the embodiment, the first photoresist layer 13 has a (first) thickness being equal to or less than a predetermined limit (e.g., 14 μm) that overlay offset measurement (by overlay measure tools) can be properly performed, and the second photoresist layer 14 has a (second) thickness being equal to or less than the predetermined limit. However, a total thickness of the second photoresist layer 14 and the first photoresist layer 13 is greater than the predetermined limit that overlay offset measurement can be properly performed.

Subsequently, still referring to FIG. 1B and FIG. 2B, a second pattern layer 15 with a predetermined second pattern acting as a mark is formed on the second photoresist layer 14. In the embodiment, the second pattern layer 15 has a second frame (i.e., the second pattern). Particularly, the second frame of the second pattern layer 15 is disposed within the opening 121 when looking down at the electronic device 100 from above. In other words, the second frame of the second pattern layer 15 is disposed within the opening 121 of the first pattern layer 12.

Referring to FIG. 1C (cross-sectional view) and FIG. 2C (top view), the second photoresist layer 14 is subjected to patterning, such as photoengraving, to form a trench 16 having a predetermined third pattern acting as a mask. In the embodiment, the trench 16 (in the second photoresist layer 14) is substantially aligned, in vertical direction, with the predetermined first pattern of the first pattern layer 12. Further, the trench 16 has a third frame (i.e., the third pattern) such that the second pattern of the second pattern layer 15 is disposed within an inner periphery of the third frame of the trench 16.

According to the embodiment as disclosed above, the electronic device 100 may then be subjected to overlay offset measurement according to the second pattern layer 15 and the trench 16 (in the second photoresist layer 14). As the thickness of the second photoresist layer 14 is equal to or less than the predetermined limit (e.g., 14 µm) that overlay offset measurement (by overlay measure tools) can be properly performed, the overlay offset among the first photoresist layer 13, the second photoresist layer 14 and the substrate 11 can therefore be properly measured.

Figure 1D:
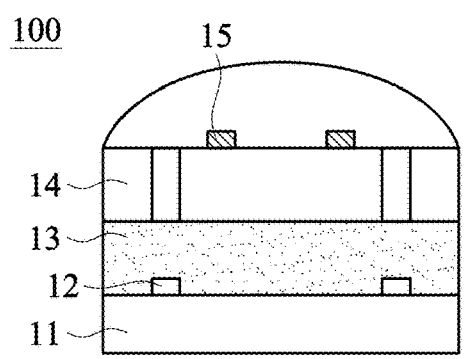

Finally, referring to FIG. 1D (cross-sectional view), a lens 17 may be formed above the second photoresist layer 14 and the second pattern layer 15, thereby forming an optoelectronic device.

Figure 3:
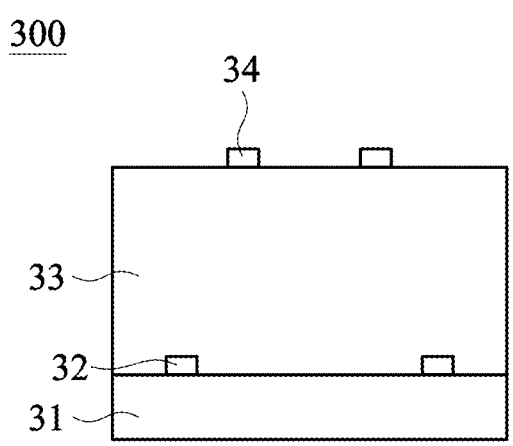
FIG. 3 shows a cross-sectional view illustrating an electronic device.

FIG. 3 shows a cross-sectional view illustrating an electronic device 300, which includes a substrate 31, a first pattern layer 32, a photoresist layer 33 and a second pattern layer 34. It is noted that the electronic device 300 (FIG. 3) has only one photoresist layer 33 instead of two photoresist layers (i.e., the first photoresist layer 13 and the second photoresist layer 14) as in the electronic device 100 (FIG. 1C). More importantly, the thickness of the photoresist layer 33 of the electronic device 300 (FIG. 3) may probably be greater than the predetermined limit (e.g., 14 µm) that overlay offset measurement can be properly performed. Therefore, the overlay measurement between the photoresist layer 33 and the substrate 31 cannot be properly performed.

To the contrary, overlay offset measurement may be properly performed on the electronic device 100 (FIG. 1C) according to the second pattern layer 15 and the trench 16 (in the second photoresist layer 14) because the thickness of either the second photoresist layer 14 or the first photoresist layer 13 is less than the predetermined limit.

Although specific embodiments have been illustrated and described, it will be appreciated by those skilled in the art that various modifications may be made without departing from the scope of the present invention, which is intended to be limited solely by the appended claims.

What is claimed is:

1. A structure for overlay offset measurement, comprising:
   a substrate;
   a first pattern layer with a predetermined first pattern formed on the substrate;
   a first photoresist layer formed on the substrate and the first pattern layer;
   a second photoresist layer formed on the first photoresist layer, the second photoresist layer being patterned to form a trench having a predetermined third pattern being aligned with the predetermined first pattern of the first pattern layer; and
   a second pattern layer with a predetermined second pattern formed on the second photoresist layer.

2. The structure for overlay offset measurement of claim 1, wherein the first photoresist layer has a first thickness being equal to or less than a predetermined limit of the overlay offset measurement, and the second photoresist layer has a second thickness being equal to or less than the predetermined limit of the overlay offset measurement.

3. The structure for overlay offset measurement of claim 2, wherein a sum of the first thickness and the second thickness is greater than the predetermined limit of the overlay offset measurement.

4. The structure for overlay offset measurement of claim 1, wherein the first pattern comprises a first frame having an opening therein, the second pattern comprises a second frame, and the trench comprises a third frame.

5. The structure for overlay offset measurement of claim 4, wherein the second frame is disposed within the opening of the first frame when looking down at the second frame from above.

6. The structure for overlay offset measurement of claim 4, wherein the second pattern of the second pattern layer is disposed within an inner periphery of the third frame of the trench.

7. The structure for overlay offset measurement of claim 1, wherein the second photoresist layer is patterned by photoengraving.

8. The structure for overlay offset measurement of claim 1, further comprising:
   a lens formed above the second photoresist layer and the second pattern layer, thereby forming an optoelectronic device.

* * * * *